(12) United States Patent
Cho et al.

(10) Patent No.: US 9,814,129 B2
(45) Date of Patent: Nov. 7, 2017

(54) PRINTED CIRCUIT BOARD AND METHOD OF FABRICATING THE SAME

(71) Applicant: LG INNOTEK CO., LTD., Seoul (KR)

(72) Inventors: Yong Seok Cho, Seoul (KR); Chang Sung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/184,511

(22) Filed: Jun. 16, 2016

(65) Prior Publication Data

US 2016/0295684 A1    Oct. 6, 2016

Related U.S. Application Data

(62) Division of application No. 14/368,198, filed as application No. PCT/KR2012/006671 on Aug. 22, 2012.

(30) Foreign Application Priority Data

Dec. 23, 2011    (KR) .................. 10-2011-0141772

(51) Int. Cl.
  *H05K 1/02*    (2006.01)
  *H05K 1/09*    (2006.01)
  (Continued)

(52) U.S. Cl.
  CPC ......... *H05K 1/0203* (2013.01); *H05K 1/0209* (2013.01); *H05K 1/09* (2013.01); *H05K 3/4644* (2013.01); *H05K 1/0227* (2013.01); *H05K 3/28* (2013.01); *H05K 2201/0376* (2013.01); *H05K 2201/09227* (2013.01); *H05K 2201/09881* (2013.01)

(58) Field of Classification Search
  CPC ...... H05K 1/0203; H05K 1/09; H05K 3/4644; H05K 2201/09227; H05K 1/0209; H05K 2201/0376; H05K 2201/09881; H05K 3/28
  See application file for complete search history.

(56) References Cited

U.S. PATENT DOCUMENTS 5,068,708 A    11/1991    Newman
5,896,271 A    4/1999    Jensen et al.
(Continued)

FOREIGN PATENT DOCUMENTS

CN    101543143 A    9/2009
CN    101861049 A    10/2010
(Continued)

OTHER PUBLICATIONS

Office Action dated Mar. 21, 2016 in Taiwanese Application No. 101133617.
(Continued)

*Primary Examiner* — Ishwarbhai B Patel
(74) *Attorney, Agent, or Firm* — Saliwanchik, Lloyd & Eisenschenk

(57) ABSTRACT

Disclosed is a printed circuit board. The printed circuit board includes an insulating layer, a copper foil formed on the insulating layer and formed therein with a groove to expose a portion of a top surface of the insulating layer, and a thermal conductive layer filled in the groove.

6 Claims, 4 Drawing Sheets

(51) Int. Cl.
*H05K 3/46* (2006.01)
*H05K 3/28* (2006.01)

(56) References Cited

U.S. PATENT DOCUMENTS

| | | | |
|---|---|---|---|
| 5,912,809 | A | 6/1999 | Steigerwald et al. |
| 6,217,987 | B1 | 4/2001 | Ono et al. |
| 6,219,255 | B1 | 4/2001 | Teshome |
| 7,326,858 | B2 | 2/2008 | Lee et al. |
| 8,217,278 | B2 | 7/2012 | Yu |
| 8,471,154 | B1 * | 6/2013 | Yoshida ............. H01L 23/3128 174/260 |
| 2001/0036065 | A1 | 11/2001 | Hirano et al. |
| 2002/0162685 | A1 | 11/2002 | Gotro et al. |
| 2006/0087037 | A1 | 4/2006 | Hsu |
| 2006/0183342 | A1 | 8/2006 | Bruyns et al. |
| 2006/0221585 | A1 | 10/2006 | Brench |
| 2007/0082183 | A1 | 4/2007 | Murai et al. |
| 2010/0230138 | A1 | 9/2010 | Asahi et al. |
| 2011/0005815 | A1 | 1/2011 | Shih et al. |

FOREIGN PATENT DOCUMENTS

| | | |
|---|---|---|
| KR | 100962369 B1 | 6/2010 |
| KR | 101055297 B1 | 8/2011 |
| TW | 200801817 A | 1/2008 |
| TW | 200829115 A | 7/2008 |

OTHER PUBLICATIONS

Office Action dated Jul. 18, 2016 in U.S. Appl. No. 14/368,198.
Office Action dated Jul. 25, 2016 in Chinese Application No. 201280070655.5.
International Search Report in International Application No. PCT/KR2012/006671, filed Aug. 22, 2012.
Office Action dated Nov. 16, 2015 in Chinese Application No. 201280070655.5.
Restriction Requirement dated Aug. 20, 2015 in U.S. Appl. No. 14/368,198.
Office Action dated Jan. 6, 2016 in U.S. Appl. No. 14/368,198.
Office Action dated Nov. 17, 2016 in U.S. Appl. No. 14/368,198.
Office Action dated Mar. 20, 2017 in U.S. Appl. No. 14/368,198.

* cited by examiner

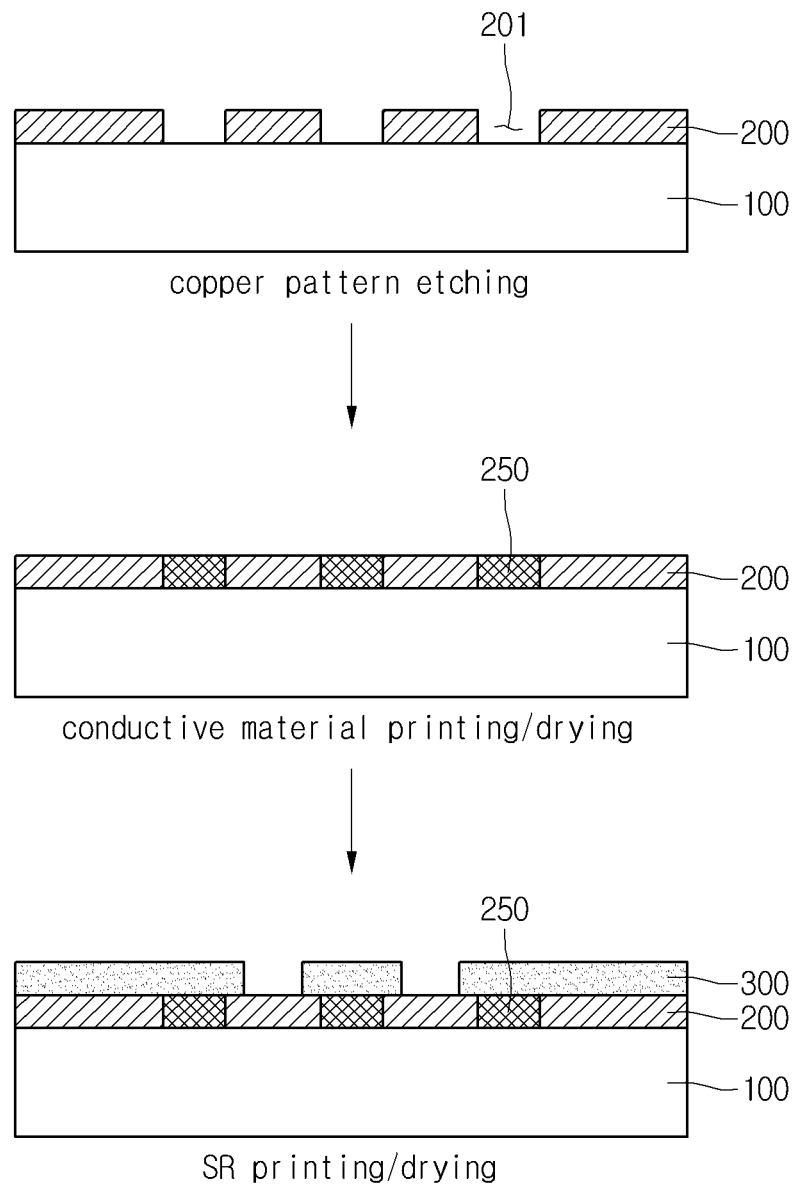

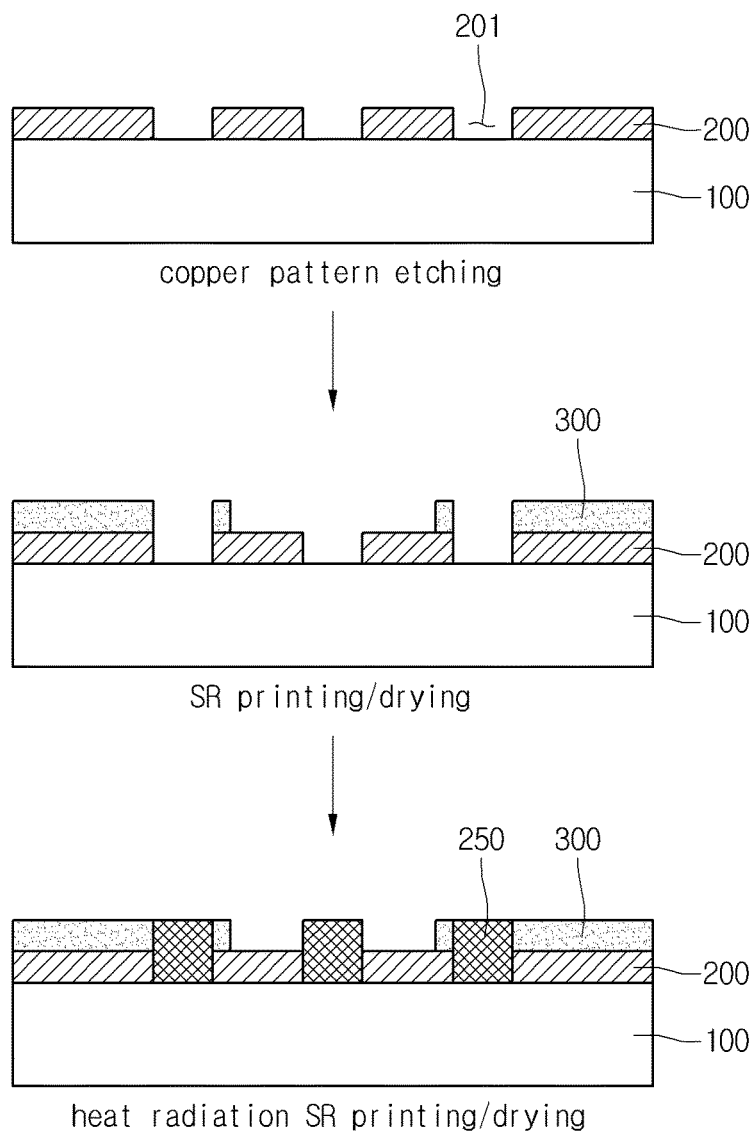

PRINTED CIRCUIT BOARD AND METHOD OF FABRICATING THE SAME

CROSS-REFERENCE TO RELATED APPLICATIONS

This application is a divisional of the U.S. application Ser. No. 14/368,198, filed Aug. 21, 2014, which is the U.S. national stage application of International Patent Application No. PCT/KR2012/006671, filed Aug. 22, 2012, which claims priority to Korean Application No. 10-2011-0141772, filed Dec. 23, 2011, the disclosures of each of which are incorporated herein by reference in their entirety.

TECHNICAL FIELD

The disclosure relates to a printed circuit board and a method of fabricating the same. In more particular, the disclosure relates to a printed circuit board capable of significantly improving heat radiation efficiency and cooling efficiency, and a method of fabricating the same.

BACKGROUND ART

In general, a printed circuit board (PCB) is a thin plate on which electrical parts such as integrated circuits, resistors, or switches are soldered. In addition, most circuits used in a computer and various display devices are mounted on the PCB.
When electronic circuits are configured by mounting the electronic parts on the PCB, the greatest issue is a countermeasure against the heat of parts to emit heat. In other words, if a predetermined voltage is applied to the electronic parts, a current flows, so that heat is emitted due to the resistance loss.

In this case, some heating electronic parts emit the slight amount of heat, so that the operation of the electronic parts may be not damaged by the natural cooling. In contrast, other heating electronic parts emit a great amount of heat, so that the temperature of the electronic parts is continuously increased in spite of the natural cooling. In this case, the electronic parts may be erroneously operated and damaged due to the increase of the temperature thereof. The heat emission causes the problems related to the reliability of the electronic parts.

However, thermal conductivity associated with the conduction of heat energy generated from the parts makes a trade-off relation with the electrical conductivity. Accordingly, the PCB satisfying the two factors may not be easily fabricated.

Technical Problem

The embodiment of the disclosure is to provide a printed circuit board capable of improving heat radiation efficiency and reliability and a method of fabricating the same.

Technical Solution

According to the embodiment of the disclosure, there is provided a printed circuit board. The printed circuit board includes an insulating layer, a copper foil formed on the insulating layer and formed therein with a groove to expose a portion of a top surface of the insulating layer, and a thermal conductive layer filled in the groove.

Advantageous Effects

According to the embodiment of the disclosure, the printed circuit board having superior heat radiation and cooling functions can be fabricated. When various electronic parts are fabricated by using the printed circuit board, a cooling structure such as a fan or a cooling pipe is not required. Accordingly, the fabricating cost and time can be reduced.

In addition, since heat emitted from products can be rapidly and effectively dissipated, the reliability of the products can be prevented from being degraded due to the heat.

DESCRIPTION OF THE DRAWINGS

FIG. 3 is a sectional view showing a method of fabricating the printed circuit board according to the embodiment of the disclosure;

FIG. 4 is a sectional view showing a method of fabricating a printed circuit board according to another embodiment of the disclosure; and FIG. 5 is a table showing the temperature variation of the printed circuit board according to the embodiment of the disclosure.

MODE FOR INVENTION

Figure 1:
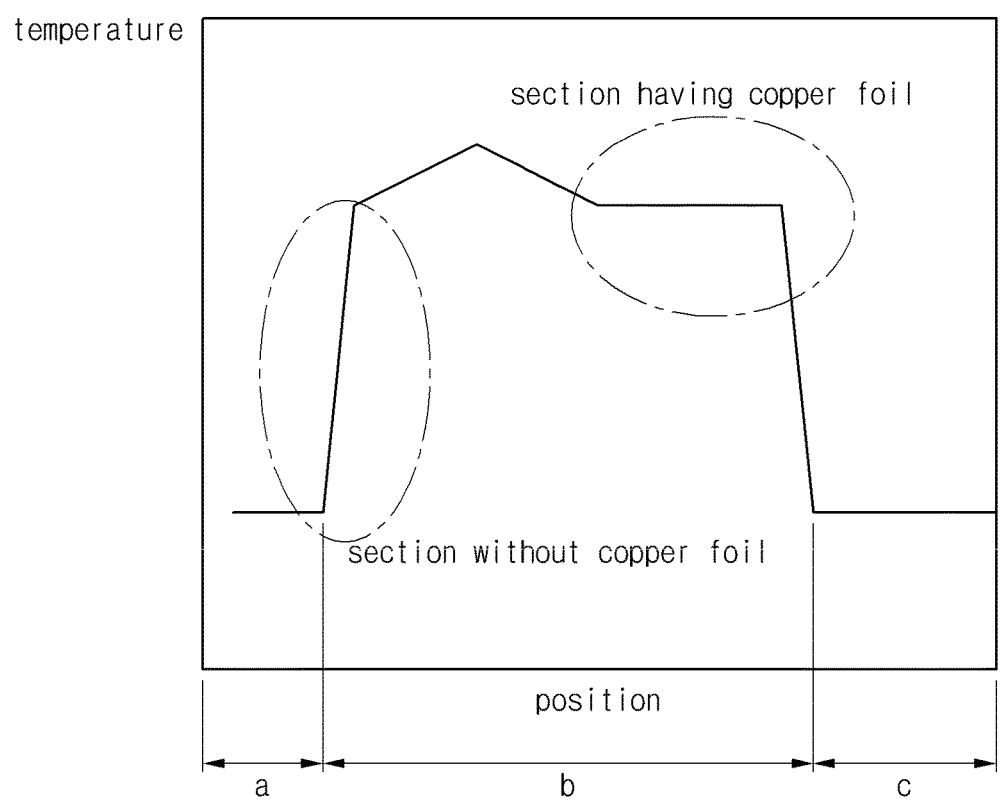
FIG. 1 is a sectional view showing the temperature variation of a printed circuit board according to the related art.

Hereinafter, exemplary embodiments of the disclosure will be described in detail with reference to accompanying drawings. The details of other embodiments are contained in the detailed description and accompanying drawings. The advantages, the features, and schemes of achieving the advantages and features of the disclosure will be apparently comprehended by those skilled in the art based on the embodiments, which are detailed later in detail, together with accompanying drawings. The same reference numerals will be assigned to the same elements throughout the whole description.

FIG. 1 is a sectional view showing the temperature variation of the printed circuit board according to the related art.

As shown in FIG. 1, in the printed circuit board according to the related art, a high temperature is represented at a section b having a copper foil, and a low temperature is represented at sections a and c without the copper foil. In other words, since the thermal conductivity is relatively low, the discrete section of the thermal conductivity exists. Accordingly, the temperature is not effectively distributed throughout the whole sections, but concentrated on one section. Therefore, the reliability for the device may be degraded.

Figure 2:
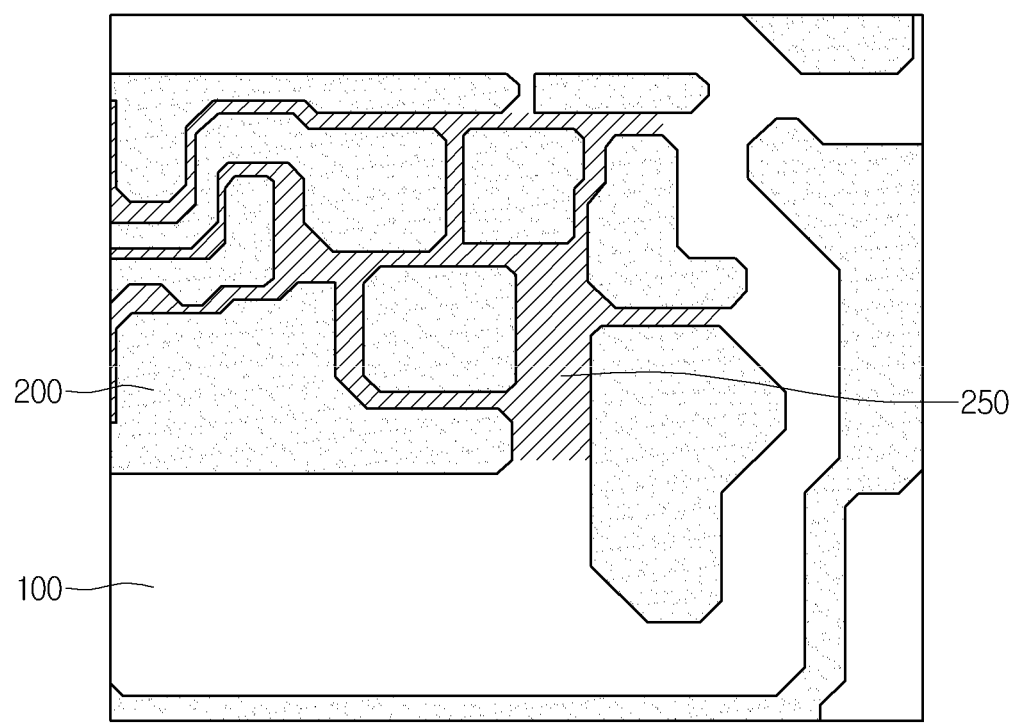
FIG. 2 is a top view showing the printed circuit board according to the embodiment of the disclosure.

FIG. 2 is a top view showing the printed circuit board according to the embodiment of the disclosure.

As shown in FIG. 2, the printed circuit board according to the embodiment includes a copper foil 200 having a predetermined pattern on an insulating layer 100 and a heat conduction layer 250 formed at a region in which the copper foil 200 is cut. The heat conduction layer 250 is formed at the region in which the copper foil 200 is cut, so that the thermal conductivity between copper foils can be improved.

FIG. 3 is a sectional view showing the method of fabricating the printed circuit board according to the embodiment of the disclosure.

First, the copper foil 200 is formed with a predetermined pattern on the insulating layer 100. In general, the printed circuit board is printed with circuits by laminating and etching a foil including copper (Cu), or a circuit pattern is printed on the printed circuit board through a screen printing scheme by using a composition used to print the circuit pattern. In detail, the composition used to print the circuit pattern includes a flux composition including nano silver powders, nano copper powders, nano magnesium powders, nano tellurium powders, nano bismuth powders, nano zirconium powders, nano titanium powders, or conductive powders, which include a mixture of at least one of the above materials, and resin.

The conductive powders are ground in a size of about 50 nm for the use thereof, and the resin may include pine resin. The conductive powders and the resin are put into a mixer and mixed with each other. Thereafter, the mixture is subject to a milling process, so that a paste-state composition for the printing of the printed circuit board can be obtained. The composition is used to print the circuit pattern through the screen printing scheme.

The circuit pattern may be formed by using the copper foil 200. The copper foil 200 may include a material representing superior electrical conductivity. A gap 201 is formed by the pattern so that copper foils 200 may be spaced apart from each other. The gap 201 may be formed through a mechanical scheme using a laser. Therefore, the top surface of the insulating layer 100 may be exposed.

The width of the gap 201 may be in the range of 1 mm to 2 mm, but the embodiment is not limited thereto.

Next, a thermal conductive layer 250 is filled in the gap 201. The thermal conductive layer 250 may have the same height as that of the copper foil 200. In other words, the lateral side of the thermal conductive layer 250 may make contact with the copper foil 200. The thermal conductive layer 250 may be formed through a photoresist scheme, and may include non-metallic materials representing superior thermal conductivity.

Subsequently, a solder resist 300 is formed on top surfaces of the copper foil 200 and the thermal conductive layer 250 through a soldering mask work. Therefore, a portion of the top surfaces of the copper foil 200 and the thermal conductive layer 250 may be exposed.

FIG. 4 is a sectional view showing a method of fabricating a printed circuit board according to still another embodiment of the disclosure.

The copper foil 200 having a predetermined pattern is formed on the insulating layer 100. The copper foil 200 includes a material representing superior electrical conductivity. The gap 201 is formed in such a manner that copper foils 200 are spaced apart from each other by the pattern. Therefore, a portion of the top surface of the insulating layer 100 may be exposed.

The width of the gap 201 may be in the range of 1 mm to 2 mm, but the embodiment is not limited thereto.

Subsequently, the solder resist 300 is formed on the top surface of the copper foil 200. The solder resist 300 is not filled in the gap 201.

Then, the thermal conductive layer 250 is formed on the top surface of the insulating layer 100 so that the thermal conductive layer 250 is filled in the gap 201. The thermal conductive layer 250 may have the same height as those of the copper foil 200 and the solder resist 300.

FIG. 5 is a table showing the temperature variation on the printed circuit board according to the embodiment of the disclosure.

When the gap 201 has a width of 1 mm and has a width of 2 mm, the temperature variation is reduced according to the formation of the thermal conductive layer.

According to the embodiment of the disclosure, since the thermal conductive layer is filled in the gap of the copper foil having a predetermined pattern, the temperature distribution of the PCB can be uniform.

Although an exemplary embodiment of the disclosure has been described for illustrative purposes, those skilled in the art will appreciate that various modifications, additions and substitutions are possible, without departing from the scope and spirit of the invention as disclosed in the accompanying claims.

What is claimed is:

1. A printed circuit board comprising:
    an insulating layer;
    a circuit pattern disposed on the insulating layer and formed therein with a first opening section to expose a portion of a top surface of the insulating layer;
    a solder resist on a top surface of the circuit pattern and formed therein with a second opening section to expose the portion of the top surface of the insulating layer and the first opening section of the circuit pattern; and
    a thermal conductive layer filled in the first opening section and the second opening section,
    wherein the thermal conductive layer has a height equal to a sum of a height of the circuit pattern and a height of the solder resist,
    wherein a top surface of the thermal conductive layer and a top surface of the solder resist are disposed on a same plane,
    wherein the first opening section is not filled with the solder resist,
    wherein the thermal conductive layer is not contacted with the top surface of the circuit pattern, and
    wherein the solder resist is not contacted with the insulating layer.

2. The printed circuit board of claim 1, wherein a lateral side of the thermal conductive layer is directly contacted with a lateral side of the circuit pattern.

3. The printed circuit board of claim 1, wherein the top surface of the thermal conductive layer is protruded over a top surface of the circuit pattern.

4. The printed circuit board of claim 1, wherein the solder resist has a third opening section to expose a portion of the top surface of the circuit pattern, and
    wherein the third opening section is not filled with the thermal conductive layer.

5. The printed circuit board of claim 1, wherein the first opening section has a width of 1 mm to 2 mm.

6. The printed circuit board of claim 1, wherein the thermal conductive layer includes non-metallic materials having thermal conductivity.

* * * * *